United States Patent [19]

Lawruk

[11] Patent Number: 5,333,376
[45] Date of Patent: Aug. 2, 1994

[54] CABLE HARNESS CONNECTOR TERMINATION AND TESTING APPARATUS

[75] Inventor: Stephen P. Lawruk, Middletown, Pa.

[73] Assignee: The Whitaker Corporation, Wilmington, Del.

[21] Appl. No.: 93,216

[22] Filed: Jul. 19, 1993

[51] Int. Cl.⁵ .................... H01R 43/04; B23P 21/00
[52] U.S. Cl. ......................... 29/861; 29/705; 29/33 F; 29/749
[58] Field of Search ............... 29/33 F, 749, 705, 755, 29/861

[56] References Cited

U.S. PATENT DOCUMENTS

| | | | |
|---|---|---|---|
| 4,109,370 | 8/1978 | Quigley | 29/749 X |
| 4,110,880 | 9/1978 | Peppler et al. | 29/33 K |
| 4,566,164 | 1/1986 | Brown et al. | 29/33 M |
| 4,580,867 | 4/1986 | Wright et al. | 29/749 X |
| 4,654,580 | 3/1987 | Keller | 29/705 X |
| 4,829,667 | 5/1989 | Thompson et al. | 29/749 |
| 4,870,747 | 10/1989 | Maack et al. | 29/755 X |
| 4,870,752 | 10/1989 | Brown et al. | 29/866 |
| 4,903,403 | 2/1990 | Brown et al. | 29/861 |

*Primary Examiner*—Carl J. Arbes

[57] ABSTRACT

A shorting bar (100) for simultaneously terminating a connector (20) to a multi-conductor cable and shorting together terminals 26 of the connector (20). The shorting bar (100) includes a termination edge (150) at an end thereof adjacent the housing (24) and a contact region (180) spaced from the terminating edge (150) a distance similar to a length between an inside floor (25) of the housing (24) and a length of terminals (26) of the connector (20). The contact region (180) is formed from an electrically conducting material. When a terminating force is applied, the shorting bar (100) is displaced toward the housing (24) until the termination edge (150) impacts the inside floor (25) of the housing (24) and terminates the terminals (26) of the connector (20) to the multi-connector cable (C). When the termination edge (150) is in contact with the housing (24), the contact region (180) contacts each of the terminals (26) of the connector (20), shorting the terminals (26) together. A continuity test can then be performed.

16 Claims, 6 Drawing Sheets

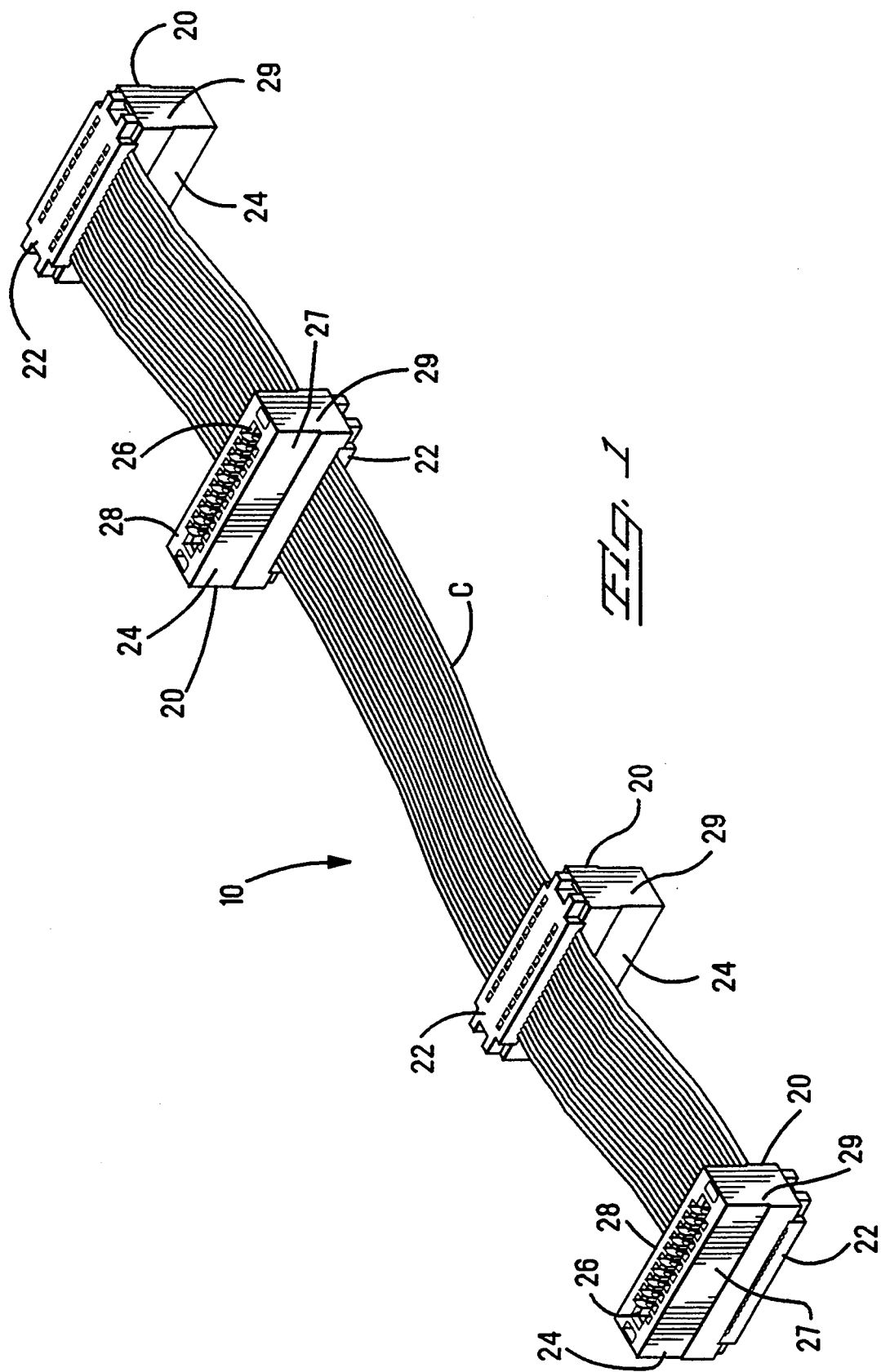

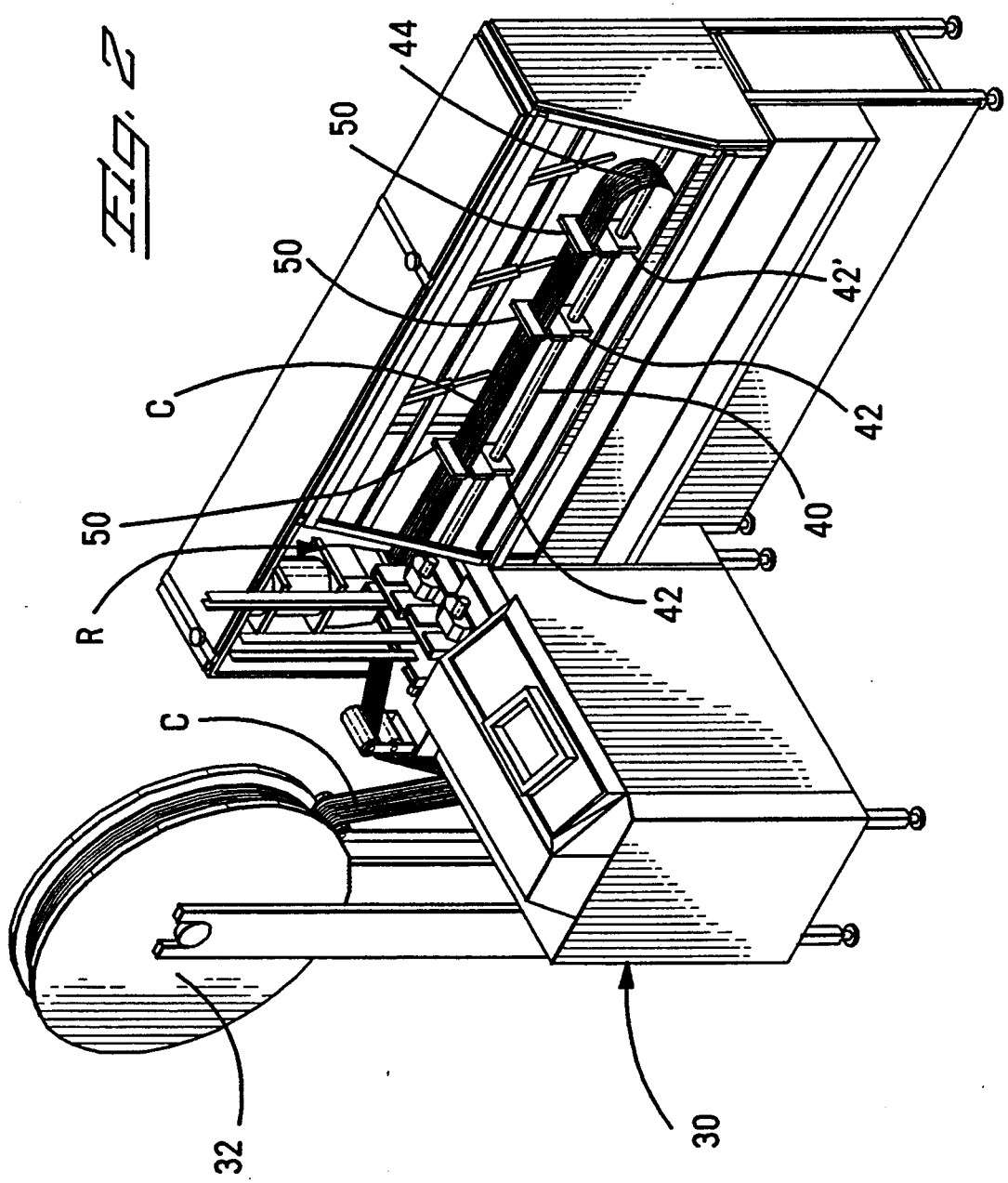

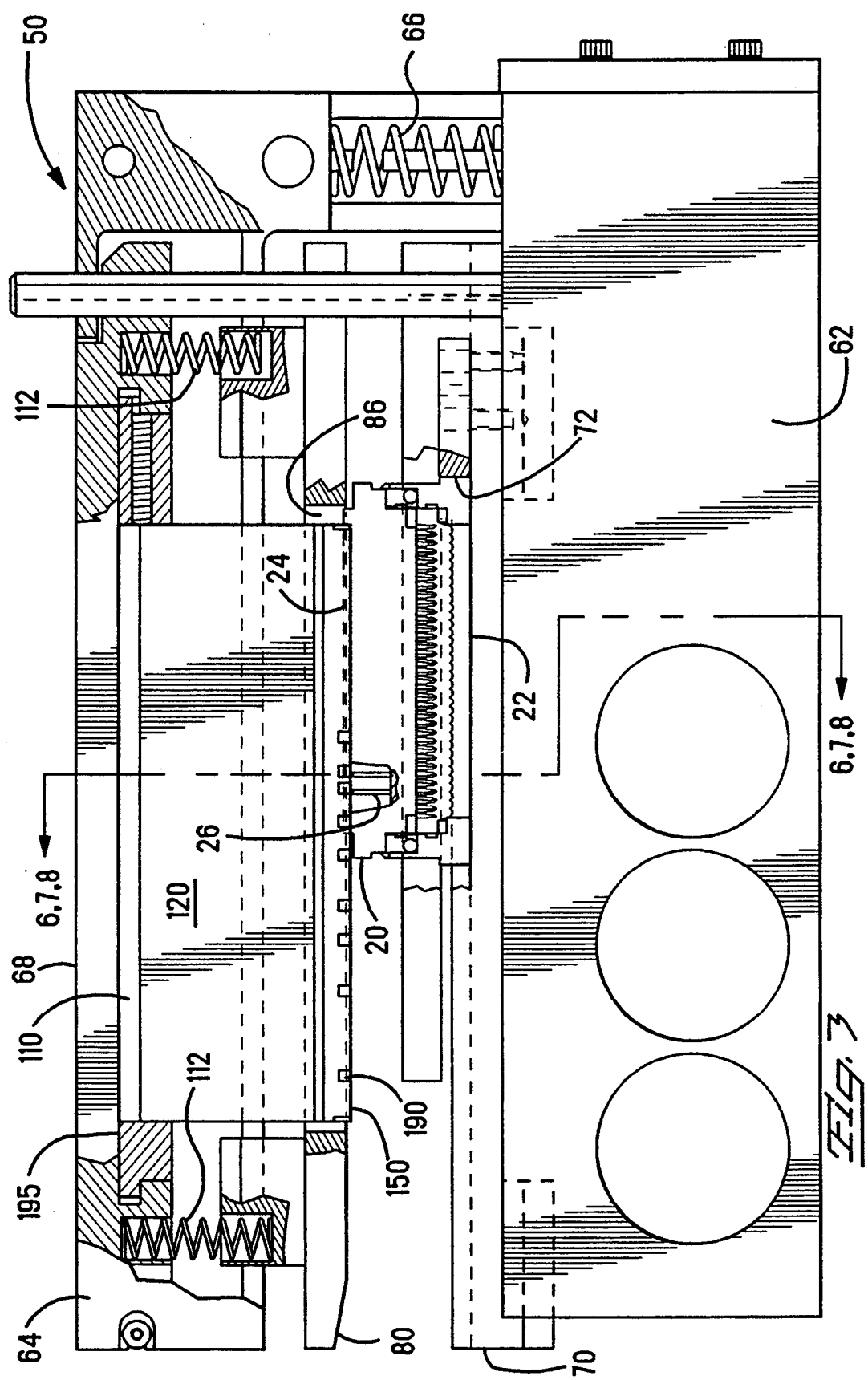

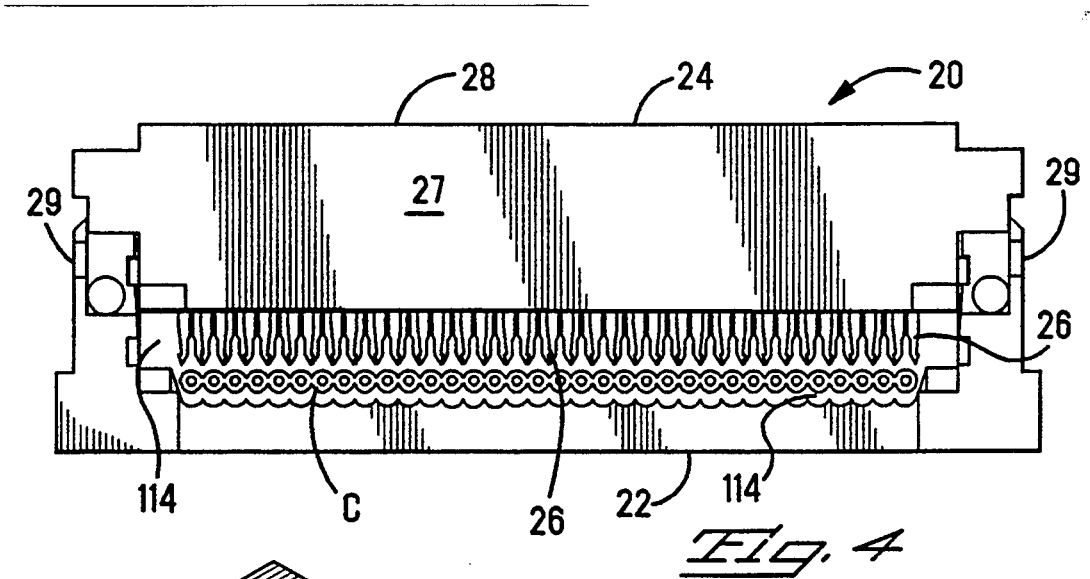
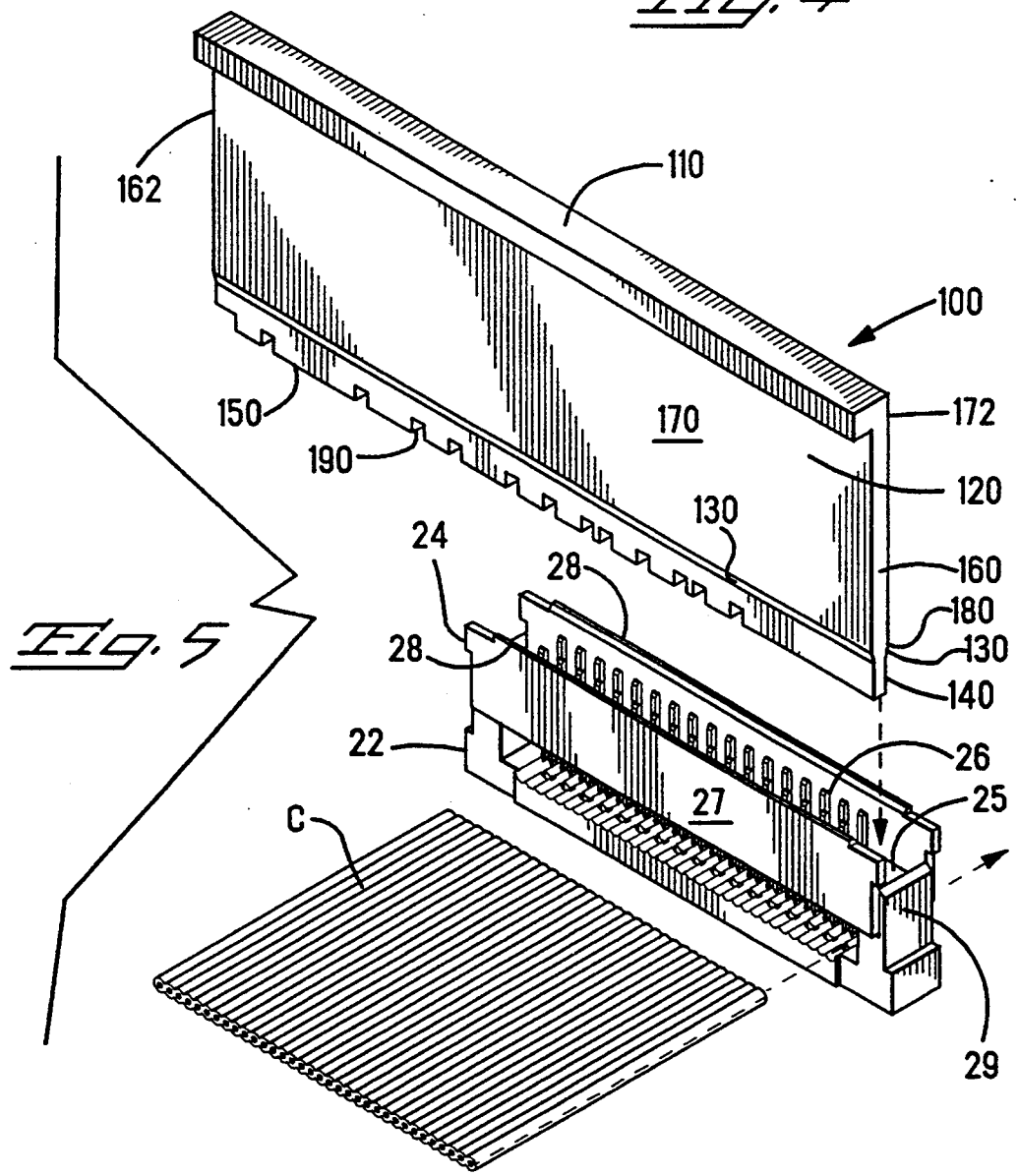

CABLE HARNESS CONNECTOR TERMINATION AND TESTING APPARATUS

FIELD OF THE INVENTION

The invention relates to an apparatus for terminating connectors to a multi-connector cable to form a cable harness, and more particularly, to an apparatus that terminates terminals of the connector to conductors within the multi-conductor cable and simultaneously shorts the terminals together for testing of the cable harness.

BACKGROUND OF THE INVENTION

Cable harnesses include one or more connectors terminated to a multi-conductor cable. They are often manufactured by a work station that automatically terminates a desired number of connectors to the multi-conductor cable at desired locations along the cable. One work station of this type is described in detail in U.S. Pat. Nos. 4,903,403 and 4,870,752. To minimize waste of multi-conductor cable and connectors, the work station includes a testing system to test the cable harness at each step in its manufacture to insure that the connectors have been properly terminated and the multi-conductor cable is free of defects. When a defect is identified, the defective portions of the cable harness are rejected before further multi-conductor cable or connectors are added to the defective cable harness.

Each cable harness is manufactured so that for each conductor within the cable, there is a corresponding terminal electrically coupled thereto within each connector. Terminating the connectors results in corresponding terminals of each connector becoming electrically connected to a corresponding conductor within the multi-conductor cable.

Testing of each cable harness includes testing for shorts and for continuity. The "shorts" testing includes testing for electrical shorts between individual conductors in the multi-conductor cable and between terminals within the connectors. The continuity testing includes testing for continuity between each terminal and the conductor of the multi-conductor cable connected thereto. One common method of testing for continuity between two terminals and the intervening multi-conductor cable, is to short all of the terminals of one connector together and then apply a signal to one of the terminals of the unshorted connector.

If proper continuity exists, this signal travels along a conductor of the multi-conductor cable to the terminals of the connector that are shorted together and then back through the other conductors of the multi-conductor cable. If continuity exists, this signal is detected by appropriate sensors coupled to the terminals of the unshorted connector. By testing for continuity after each connector (excluding the first connector) is terminated, the cable harness may be rejected immediately upon the detection of lack of continuity and before further connector termination to the multi-conductor cable and waste of further connectors and multi-conductor cable.

Apparatus for shorting terminals together presently require that the work station utilize multiple tooling apparati for both termination and for shorting to test for continuity. In these work stations, a ram compresses a module surrounding a connector which has not yet been terminated. The connector has the multi-conductor cable passing therethrough. The ram causes tooling within the module to contact a housing of the connector, driving the housing and the terminals supported thereby toward a cover of the connector on a side of the multi-conductor cable opposite the housing.

This tooling applies a force to the housing sufficient to terminate the terminals to conductors within the cable and also cause the terminals to be connected to the cover. Simultaneously, shorting tooling within the module and adjacent the cover is forced into electrical connection with the terminals of the connector, causing the terminals to be shorted together. Thus, one tooling apparatus terminates the connector to the multi-conductor cable and a second tooling apparatus shorts the terminals together. After testing is complete, the ram is released and the termination tooling and the shorting tooling disengages from the terminals.

While this system effectively terminates and shorts the terminals together, it increases the number of tooling apparati necessary for work station operation. In addition, the shorting tooling is inherently delicate in that it must have probes passing through holes in the cover. This shorting tooling is thus subject to breakage or premature failure.

SUMMARY OF THE INVENTION

This invention provides a shorting bar within the modules. The shorting bar is configured to apply force to the housing of the connector, driving the connector into termination with the multi-conductor cable and the cover. The shorting bar is dimensioned to simultaneously come in contact with the terminals of the connector and is formed from an appropriately electrically conducting material to short the terminals together. When the ram drives the shorting bar against the housing and terminates the connector, the shorting bar shorts together the terminals. Testing for continuity is then performed. When the ram is released, the shorting bar moves away from the housing and simultaneously comes out of electrical contact with the terminals. Upon further terminating and testing of other connectors along the cable harness, the shorting bars of modules supporting previously terminated connectors do not short the terminals together.

Other advantages and results of the invention are apparent from a following detailed description by way of example of the invention and from accompanying drawings.

DESCRIPTION OF THE DRAWINGS

FIG. 1 is an isometric view of a cable harness with four connectors terminated thereto.

FIG. 2 is an isometric view of a work station which terminates connectors to multi-connector cable.

FIG. 3 is an elevational view of a module of the work station of FIG. 2 with portions thereof cut away to reveal interior details thereof.

FIG. 4 is an elevational view of a connector with multi-conductor cable passing between a housing and a cover of the connector before termination of the connector.

FIG. 5 is an isometric view of a segment of multi-conductor cable, a connector and a shorting bar utilized in terminating the connector and shorting terminals of the connector for testing.

DESCRIPTION OF THE PREFERRED EMBODIMENTS

Figure 6:
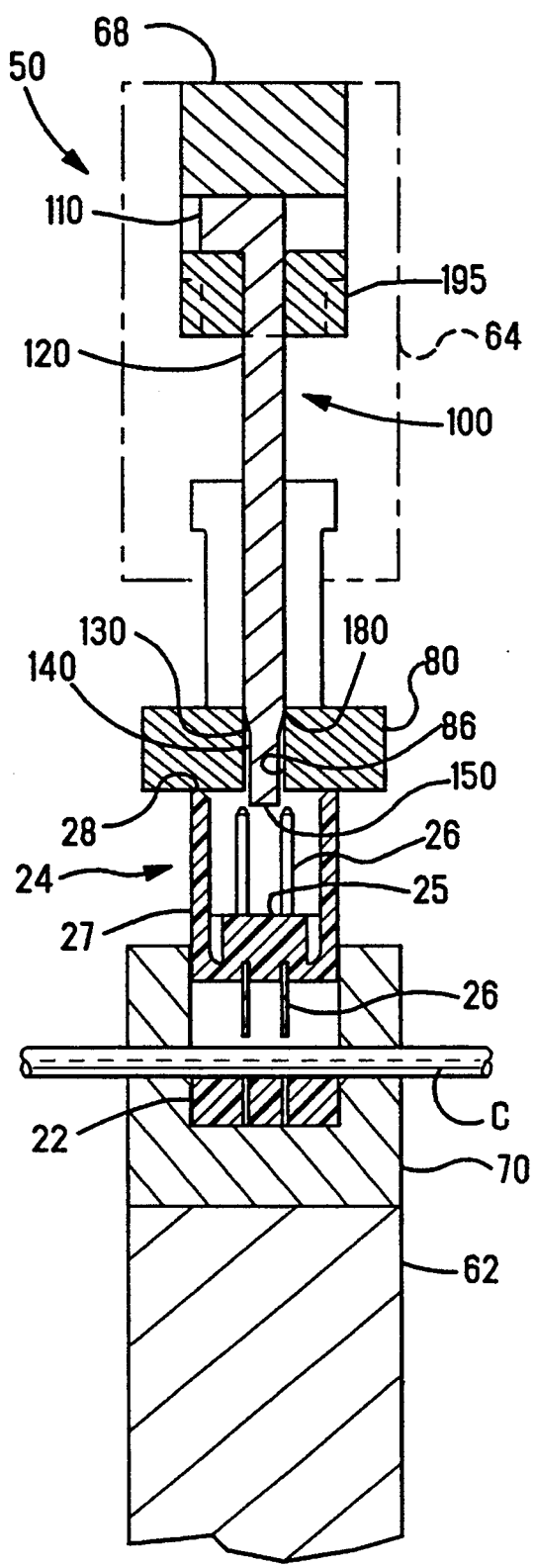
FIG. 6 is a sectional view taken along line 6—6 of FIG. 3.

With more particular reference to the drawings, FIG. 1 shows a cable harness 10 with multiple connectors 20 terminated to a multi-conductor cable C of the cable harness 10. Each connector 20 includes a cover 22 on one side of the cable C and a housing 24 on an opposite side of the cable C. An inside floor 25 of the housing 24 (FIG. 5) has terminals 26 extending perpendicularly therefrom. The terminals 26 are configured within each connector 20 in electrical connection with a different conductor of the cable C when the connector 20 is properly terminated to the connector C. The terminals 26 extend between and parallel to side walls 27 of the housing 24. The side walls 27 form a rim 28 at an end of the side walls 27 opposite the cover 22. The cover includes end walls 29 extending parallel to the terminals 26 with a top on an end nearest the housing 24.

With reference to FIG. 2, a work station 30, which performs as a cable harness 10 assembly machine, includes a dereeler 32 which supports multi-conductor cable C before termination of connectors 20 thereto. The work station 30 includes a guide rail 40 with carriages 42 that slide therealong. A lead carriage 42' includes testing cable 44 connected thereto. Each carriage 42 supports a module assembly 50 thereon. The module assemblies 50 provide a means to support a connector 20 therewithin before, during and after the termination of the connector 20 to the cable C. The work station 30 terminates the connectors 20 by activating a ram R which compresses the cover 22 and the housing 24 together. The ram R thus provides a means to apply compression force F (FIGS. 7 and 8) to the module assembly 50 and the connector 20.

With reference to FIG. 3, the module assembly 50 includes a cover jaw 62 and a housing jaw 64 oriented parallel to each other and held in spaced relation by a module main spring 66. Each module assembly 50 can be supported by the carriage 42 (FIG. 2) with either the cover jaw 62 adjacent the carriage 42 or with the housing jaw 64 adjacent the carriage 42. Reversing the orientation of one module assembly 50 with respect to an adjacent module assembly 50 causes adjacent connectors 20 to be inverted with respect to each other (see for example FIG. 1). The housing jaw 64 includes a base 68 at an end of the housing jaw 64 distant from the cover jaw 62.

The module assembly 50 includes a cover insert 70 replaceably supportable within the cover jaw 62 of the module assembly 50. A connector stop 72 forms part of one end of the cover insert 70 and extends away from the cover jaw 62 and toward the housing jaw 64. The cover insert 70 is configured to support the cover 22 of a non-terminated connector 20 thereagainst, and yet allow the connector 20 to slide into the module assembly 50 between the jaws 62, 64 until the connector 20 abuts against the connector stop 72. With the connector 20 adjacent the connector stop 72, the connector 20 is in position for termination. The cover insert 70 aligns the connector 20 within the module assembly 50 for proper termination of the connector 20.

A housing insert 80 is connectable to a side of the housing jaw 64 closest to the cover insert 70. The housing insert 80 supports the housing 24 of the connector 20. A non-terminated connector 20 fits snugly between the cover insert 70 and the housing insert 80. When connectors 20 having different predetermined heights are utilized, housing inserts 80 and cover inserts 70 of appropriately modified dimensions are utilized so that the connector 20 can always be slid easily between the inserts 70, 80, into and out of position within the module 50.

The housing insert 80 includes a clearance passage 86 therein which allows a shorting bar 100 (FIG. 5) to pass therethrough. The clearance passage 86 is dimensioned large enough to allow the shorting bar 100 to pass therethrough and yet small enough that the housing insert 80 remains in contact with the rim 28 of the housing 24 at all times, preventing the housing 24 from being displaced into the clearance passage 86.

The shorting bar 100 (FIG. 6) is replaceably located within the housing jaw 64 with a ledge 110 adjacent the base 68 of the housing jaw 64. The housing insert 80 is coupled to the housing jaw 64 through a spring assembly 112 which allows the housing insert 80 to be compressed toward the housing jaw 64 somewhat.

The ram R compresses the module assembly 50, by applying the force F (FIGS. 7 and 8), causing the cover jaw 62 and the housing jaw 64 to be compressed toward each other. The housing insert 80 remains in contact with the housing 24, but is compressed toward the housing jaw 64, preventing the housing 64 from becoming damaged. However, the shorting bar 100, which is directly coupled to the base 68, passes through the alignment passage 86 of the housing insert 80 and into contact with the housing 24. The ram R and the shorting bar 100 thus provide a means for driving the housing 24 relatively toward the cable C such that the terminals 26 are terminated to the conductors within the cable C. The cover 22 provides a means to support the cable C during the termination.

With reference to FIG. 4, further details of the connector 20, before termination to the cable C, are shown. Each connector 20 includes the cover 22 mechanically supported by the housing 24 and spaced from the housing 24. The end walls 29 of the cover 22 are connected to the side walls 27 of the housing 24 through a latch in a first unterminated position until the force F is applied, causing the latch to deform and the housing 24 and cover 22 to move into a terminated position with respect to each other. A space 114 exists between the cover 22 and the housing 24 large enough for the cable C to pass therethrough. The terminals 26 extend from the housing 24 and toward the cover 22. Each terminal 26 is precisely spaced from other terminals 26 so that each terminal 26 will only connect to one unique conductor within the multi-connector cable C.

During termination, the housing 24 and cover 22 are compressed together with the terminals 26 coming into engagement with the cable C and locking the cover 22 to the housing 24 with the cable C trapped therebetween. For the cable harness 10 to function properly, each terminal 26 must be in electrical contact with a unique conductor of the multi-conductor cable C and each conductor within the cable C must be in electrical contact with a unique terminal 26 of the connector 20. Testing the cable harness 10 for continuity ensures that termination of each connector 20 has appropriately electrically connected each terminal 26 to a unique conductor within the cable C. Testing for continuity also simultaneously tests for any defects within the cable C between connectors 20 along the cable harness 10 due to one of the conductors within the cable C being discontinuous.

With reference to FIG. 5, the housing 24 includes the inside floor 25 which supports the side walls 27 of the housing 24. The inside floor 25 has the terminals 26 passing perpendicularly therethrough. The terminals 26 are oriented in two parallel rows which are spaced apart by a constant distance. The shorting bar 100 passes between the two rows of terminals 26 during termination of the connector 20 and impacts the inside floor 25 of the housing 24 forcing the housing 24 toward the cover 22.

The shorting bar 100 is substantially an inverted "L" shape and includes the ledge 110 extending transversely from the upper tooling 120. The upper tooling 120 then transitions at a transition 130 into lower tooling 140. A termination edge 150 of the lower tooling 140 has a surface perpendicular to end walls 160, 162 of both the upper tooling 120 and the lower tooling 140. The shorting bar 100 has a constant height between the termination edge 150 and the ledge 110 and a constant length between the first end wall 160 and the second end wall 162. The shorting bar 100 has a variable width, at the transition 130, between a front surface 170 and a rear surface 172 of the shorting bar 100. The lower tooling 140 has a lesser width than the upper tooling 120.

An electrically conductive contact region 180 (FIGS. 5 through 8) defines a portion of the upper tooling 120 directly adjacent the transition 130 which comes into contact with the terminals 26 when the termination edge 150 comes into contact with the inside floor 25. The contact region 180 is spaced from the termination edge 150 a distance equal to a length of the terminals 26. The contact region 180 thus provides a means to electrically short the terminals 26 of the connector 20.

The termination edge 150 (FIG. 5) includes a plurality of notches 190 thereon. Because different length connectors 20 will be terminated by the machine, the notches 190 are each placed a distance from the first end wall 160 of the shorting bar 100 similar to a length of a corresponding connector 20 potentially receivable within the module assembly 50. The cover 22 includes end walls 29 that extend above the inside floor 25 of the housing 24 after termination of the connector 20. The notches 190 have a depth away from the termination edge 150 sufficient to receive the end walls 29 of various connectors 20 utilizable within the work station 30 and thus prevents the shorting bar 100 from contacting the end walls 29 of the cover 22.

Figure 7:
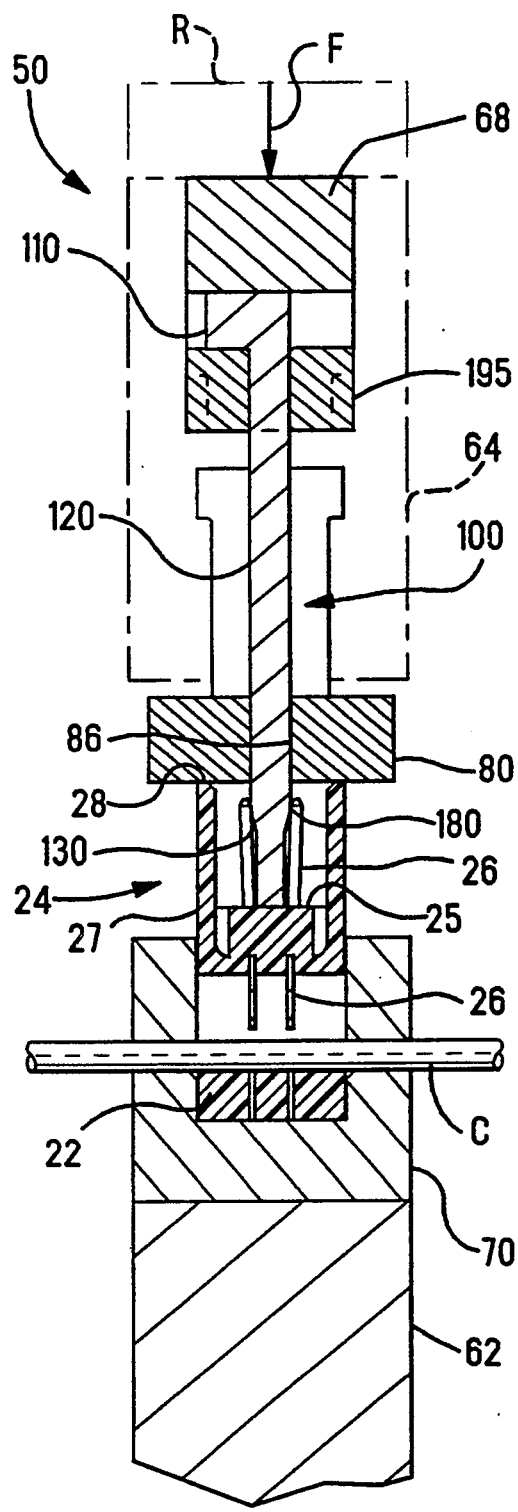
FIG. 7 is a sectional view taken along line 7—7 of FIG. 3 and representing a configuration of the module immediately before termination of the connector.
Figure 8:
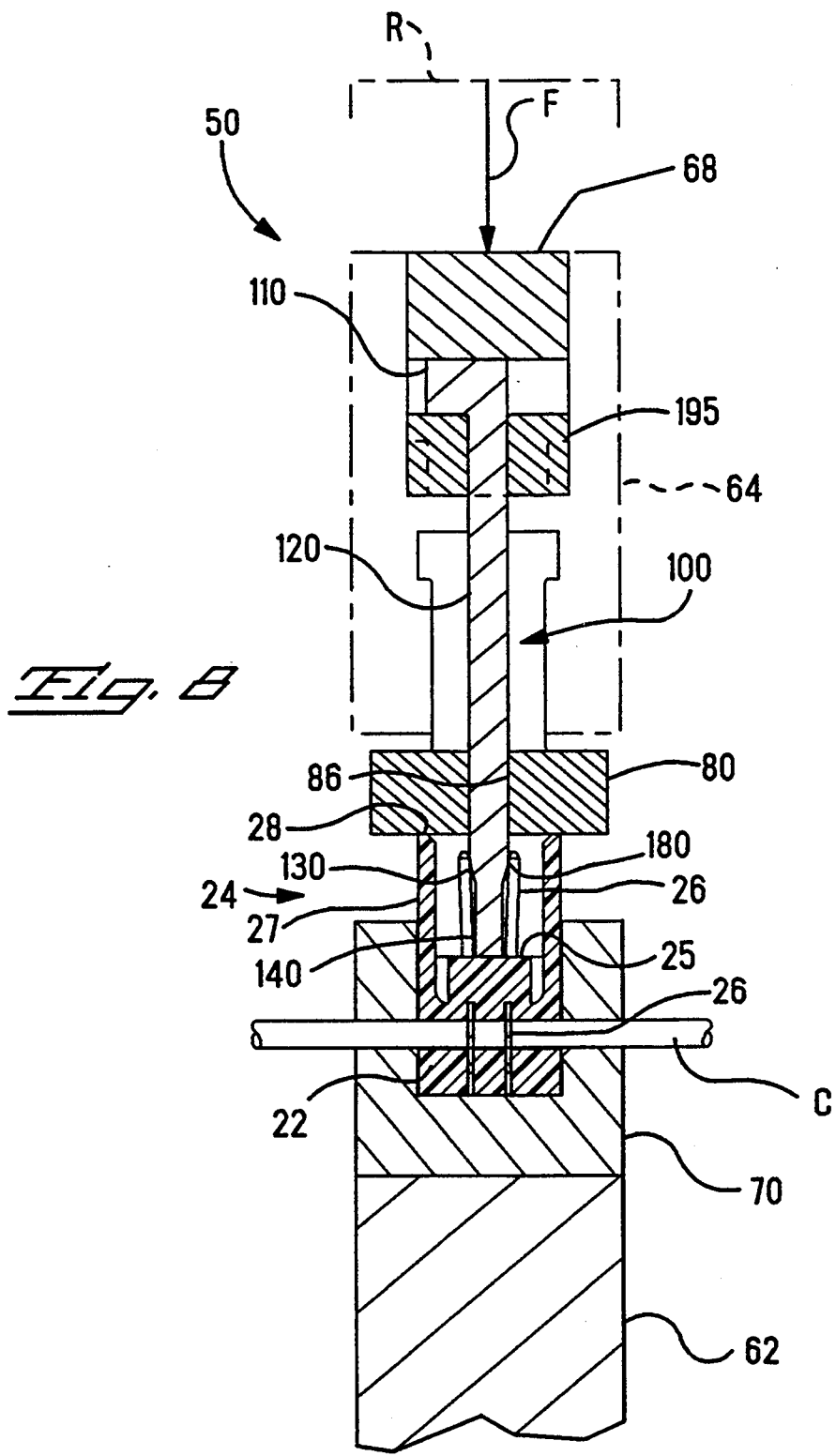
FIG. 8 is a sectional view taken along lines 8—8 of FIG. 3 representing the module as it would appear immediately after terminating the connector.

With reference to FIGS. 6 through 8, the shorting bar 100 includes the ledge 110 which is wider than the upper tooling 120 of the shorting bar 100. The ledge 110 rests above an insert retainer 195 which prevents the shorting bar 100 from falling through the alignment passage 86 in the housing insert 80. The termination edge 150 is provided with a width which is less than a distance between the two rows of terminals 26. Thus, when the shorting bar 100 is passed through the alignment passage 86 in the housing insert 80 and addresses the inside floor 25 of the housing 24, the termination edge 150 does not contact the terminals 26. This dimensioning prevents the tip 150 from damaging the terminals 26 where the terminals 26 connect to the inside floor 25.

The transition 130 causes the shorting bar 100 to transition in width to an upper tooling 120 width surrounding the contact region 180 which is greater than a width of the shorting bar 100 of the termination edge 150. The contact region 180 has a width slightly greater than a distance between the two rows of terminals 26. Thus, when the shorting bar 100 is compressed against the housing 24, the contact region 180 comes into contact with the terminals 26.

By way of example, many connectors 20 include terminals 26 that are 15/1000 of an inch square in cross-section, and are spaced apart in rows that are 100/1000 of an inch apart, center to center. An effective shorting bar 100 has included upper tooling 120 of 120/1000 in thickness and lower tooling 140 of 70/1000 in thickness.

The shorting bar 100 is formed from an electrically conductive material such as tooling steel so that when the shorting bar 100 comes into contact with the inside floor 25 of the housing 24 the terminals 26 become shorted together. When the shorting bar 100 has terminated the connector 20 with the terminals 26 in electrical contact with conductors within the cable C, all of the conductors within the cable C are shorted together through the terminals 26 and shorting bar 100. When the shorting bar 100 is relocated away from the connector 20, the contact region 180 disengages the terminals 26 and provides the terminals 26 in a non-shorted configuration.

In termination and testing of a cable harness 10, initially a first connector 20 is terminated to the cable C. This first connector 20 is then translated along the guide rail 40, along with the associated carriage 42 and module assembly 50. The module assembly 50 of the first connector 20 includes testing cable 44 coupled thereto which has a testing probe electrically coupled to each of the terminals 26 of the first connector 20. The first connector 20 is translated along the guide rail 40 a distance equal to a desired distance between the first connector 20 and the second connector 20. When this distance has been reached, the second connector 20 is terminated to the cable C.

During termination of the second connector 20, the shorting bar 100 causes the terminals 26 at the second connector 20 to be shorted together. During this period, a continuity test signal is provided to one of the conductors within the testing cable 44 from an electric signal source causing the signal to be translated through the terminal 26 of the first connector 20 associated therewith. The signal then travels along the conductor of the multi-conductor cable C coupled thereto, to the terminal 26 of the second connector 20 through the contact region 180 of the shorting bar 100, and then to each of the terminals 26 of the second connector 20.

This signal is then passed back through each of the conductors of the cable C, back to the terminals 26 of the first, non-shorted, connector 20 and into the testing probes of the testing cable 44. Monitoring of the individual testing probes of the testing cable 44 results in detection of the signal inputted by the testing cable 44, unless a discontinuity exists in one of the conductors or between one of the conductors of the cable C and one of the terminals 26 of either the first connector 20 or the second connector 20. The shorting bar 100, testing cable 44 and electric signal source provide a means for testing continuity of the cable 10.

If such a discontinuity is discovered, the cable C can be sheared off and the non-continuous cable harness 10 discarded. If the signal is detected within each of the conductors of the testing cable 44, proper termination of both the first connector 20 and the second connector 20 is indicated. The carriages 42 of both the first connector 20 and the second connector 20 can then be moved along the guide rail 40 until a desired cable C length between the second connector 20 and the third connector 20 is reached.

The third connector 20 is then terminated, simultaneously causing terminals 26 of the third connector 20 to be shorted together. Testing can then be reperformed in a manner similar to that performed between the first connector 20 and the second connector 20 to ensure that the cable C is continuous between the first connector 20 and the third connector 20 and that the third connector 20 has been properly terminated to the cable C. This terminating and testing process is continued until either a lack of continuity is detected or the cable harness 10 is completed.

Other advantages of the invention are apparent from the detailed description by way of example, and from accompanying drawings, and from the spirit and scope of the appended claims.

What is claimed is:

1. Apparatus for terminating a connector having terminals to conductors of a multi-conductor cable, and for testing a resulting connector and multi-conductor cable assembly, the apparatus comprising:

means to support the cable during termination to the connector thereto;

means for driving the connector relatively toward the cable so as to terminate the terminals of the connector to the conductors within the cable, wherein said means for driving includes means for electrically shorting together at least two of the terminals of the connector; and, means for testing continuity of the conductors which are terminated to the at least two terminals.

2. Apparatus as recited in claim 1, wherein the means for driving includes a shorting bar having a termination edge oriented adjacent the connector, the shorting bar being movable toward the connector with the termination edge engaging the connector.

3. Apparatus as recited in claim 2, wherein the shorting bar has an electrically conductive contact region dimensioned to contact the at least two terminals when the termination edge of the shorting bar engages the connector.

4. Apparatus as recited in claim 3, wherein the terminals of the connector are oriented in two substantially parallel spaced apart rows, the termination edge of the shorting bar has a width less than a distance between the two parallel rows of terminals, and the contact region of the shorting bar has a width not less than a distance between the two parallel rows of terminals.

5. Apparatus as recited in claim 1, wherein the means for driving includes an electrically conductive contact region configured to contact each of the terminals when the means for driving engages the connector.

6. Apparatus as recited in claim 2, wherein the connector is selectable from among a group of connectors having different lengths, and wherein the termination edge of the shorting bar defines at least one notch dimensioned to receive an end wall of a selected one of the connectors.

7. A method for testing the continuity of a multi-conductor cable connector harness assembly after termination of a connector thereto, comprising the steps of:

configuring a shorting bar to have a termination edge and an electrically conducting contact region having a cross-sectional width similar to a distance between terminals of the connector, locating the shorting bar with the termination edge adjacent the connector and the contact region in contact with the terminals, applying a compression force to the connector through the termination edge, the force sufficient to terminate the connector to the cable, and applying a continuity test signal to the cable harness.

8. A method as recited in claim 7, and preceded by the steps of:

terminating a first connector to the multi-conductor cable, and coupling an electric signal source to one of the terminals within the first connector.

9. A method as recited in claim 8, and further including the steps of:

applying an electrical signal to one of the terminals within the first connector, and monitoring the other terminals of the first connector that did not have the signal applied thereto to determine if a signal is received.

10. A method as recited in claim 7, and further including the step of:

configuring the connector to have the terminals in two parallel rows spaced from each other a constant distance and configuring the shorting bar to have the terminals in two parallel rows spaced from each other a constant distance and configuring the shorting bar to have the termination edge thereof with a width less than a distance between the two rows of terminals and the contact region having a width not less than a distance between two rows of terminals.

11. A method as recited in claim 7, wherein the shorting bar is configured to reside within a module, the module supporting the connector with the multi-connector cable passing between a housing and a cover of the connector, the module supporting the shorting bar therein and aligning the termination edge of the shorting bar between the two parallel rows of terminals of the connector.

12. A method as recited in claim 7, and further including the step of releasing the compression force and displacing the shorting bar from between the parallel rows of terminals of the connector.

13. Apparatus for terminating a connector having terminals to conductors of a multi-conductor cable, and for testing a resulting connector and multi-conductor cable assembly, the apparatus comprising:

a shorting bar configured to simultaneously engage the connector and to electrically short together at least two of the terminals of the connector;

means to apply a compression force to drive the connector and the cable relatively together such that terminals of the connector are terminated to the conductors within the cable, wherein the compression force is applied to the connector by the shorting bar; and, means for testing continuity of the conductors which are terminated to the at least two terminals.

14. Apparatus as recited in claim 13, wherein the shorting bar has an electrically conductive contact region dimensioned to contact the at least two terminals when a termination edge of the shorting bar engages the connector.

15. Apparatus as recited in claim 14, wherein the terminals of the connector are oriented in two substantially parallel spaced apart rows, the termination edge of the shorting bar has a width less than a distance between the two parallel rows of terminals, and the contact region of the shorting bar has a width not less than a distance between the two parallel rows of terminals.

16. Apparatus as recited in claim 14, wherein the connector is selectable from among a group of connectors having different lengths, and wherein the termination edge of the shorting bar defines at least one notch dimensioned to receive an end wall of a selected one of the connectors.

* * * * *